US009137912B1

(12) United States Patent
Wu et al.

(10) Patent No.: US 9,137,912 B1
(45) Date of Patent: Sep. 15, 2015

(54) CASING OF ELECTRONIC DEVICE AND METHOD OF MANUFACTURING THE SAME

(71) Applicant: HTC Corporation, Taoyuan County (TW)

(72) Inventors: Tim Chung-Ting Wu, Taoyuan County (TW); Chi-Jen Lu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 314 days.

(21) Appl. No.: 13/760,004

(22) Filed: Feb. 5, 2013

(51) Int. Cl.
B29C 65/50 (2006.01)
B32B 38/10 (2006.01)
H05K 5/02 (2006.01)
H05K 13/00 (2006.01)

(52) U.S. Cl.
CPC .............. *H05K 5/0217* (2013.01); *H05K 13/00* (2013.01)

(58) Field of Classification Search
CPC .. H05K 5/0217; H05K 13/00; B29C 63/0013; B29C 65/50; B32B 7/06; B32B 38/10; Y10T 156/11; Y10T 156/1168; Y10T 156/1195
USPC .................................. 156/247, 701, 714, 719
See application file for complete search history.

(56) References Cited

U.S. PATENT DOCUMENTS 3,664,861 A * 5/1972 Okamura et al. ............. 427/507
3,936,368 A * 2/1976 Watanabe et al. ............. 204/478
4,051,194 A * 9/1977 Ishikawa et al. ............. 525/386
4,051,302 A * 9/1977 Mayama et al. ............. 428/345
4,064,030 A * 12/1977 Nakai et al. ............... 204/192.36
4,066,820 A * 1/1978 Kelly et al. .................... 428/483
4,096,315 A * 6/1978 Kubacki ........................ 428/412
4,104,225 A * 8/1978 Conbere ........................ 524/417
4,104,390 A * 8/1978 Ferrand et al. ................ 514/301
4,121,006 A * 10/1978 Harada et al. ................. 428/172
4,137,365 A * 1/1979 Fletcher et al. ............... 428/412
4,139,506 A * 2/1979 Thoese et al. .................... 524/37
4,155,826 A * 5/1979 Nakai et al. ............... 204/192.36
4,202,805 A * 5/1980 Kato et al. ..................... 525/384
4,264,656 A * 4/1981 Reeder ........................ 427/385.5
4,292,397 A * 9/1981 Takeuchi et al. .............. 430/303
4,294,939 A * 10/1981 Taniguchi et al. ............. 525/118
4,309,460 A * 1/1982 Singh et al. .................... 427/250
4,312,902 A * 1/1982 Murase et al. ................ 427/386
4,321,404 A * 3/1982 Williams et al. .............. 560/115
4,324,708 A * 4/1982 Ito et al. ......................... 524/599
4,340,276 A * 7/1982 Maffitt et al. ................. 359/581

(Continued)

FOREIGN PATENT DOCUMENTS

DE 102010006755 8/2011
WO 0024527 5/2000

*Primary Examiner* — Sing P Chan
(74) *Attorney, Agent, or Firm* — Jianq Chyun IP Office

(57) ABSTRACT

A casing of an electronic device and a manufacturing method thereof are provided. The manufacturing method of casing of the electronic device includes following steps: providing a casing body, in which the surface of the casing body includes a first material region and a second material region, and the materials of the first material region and the second material region are different from each other; providing a decorative material on the surface of the casing body, in which the decorative material overlays whole the first material region and at least partial the second material region; and adhering a tape on the decorative material, followed by tearing off the tape to remove the decorative material located at the second material region but remain the decorative material located at the first material region.

12 Claims, 6 Drawing Sheets

(56) References Cited

U.S. PATENT DOCUMENTS

| | | | |
|---|---|---|---|
| 4,357,404 A * | 11/1982 | Osawa et al. | 430/49.1 |
| 4,377,050 A * | 3/1983 | Renholts | 40/615 |
| 4,388,345 A * | 6/1983 | Kishida et al. | 427/512 |
| 4,598,003 A * | 7/1986 | Renholts | 428/40.7 |
| 4,612,242 A * | 9/1986 | Vesley et al. | 428/313.9 |
| 4,725,459 A * | 2/1988 | Kimura et al. | 427/412.5 |
| 4,756,975 A * | 7/1988 | Fujii et al. | 428/461 |
| 4,786,558 A * | 11/1988 | Sumiya et al. | 428/454 |
| 4,895,767 A * | 1/1990 | Mori et al. | 428/447 |
| 4,950,360 A * | 8/1990 | Murao et al. | 216/23 |
| 4,956,231 A * | 9/1990 | Cavezzan et al. | 428/343 |
| 4,966,933 A * | 10/1990 | Kawakami et al. | 524/310 |
| 4,973,393 A * | 11/1990 | Mino et al. | 148/535 |
| 4,996,076 A * | 2/1991 | Nakaya et al. | 427/532 |
| 5,006,190 A * | 4/1991 | Earle | 156/247 |
| 5,028,292 A * | 7/1991 | Incremona et al. | 156/272.6 |
| 5,077,348 A * | 12/1991 | Nakamura et al. | 524/512 |
| 5,085,932 A * | 2/1992 | Fujita et al. | 428/331 |
| 5,104,692 A * | 4/1992 | Belmares | 427/164 |
| 5,108,796 A * | 4/1992 | Yamanaka et al. | 427/379 |
| 5,262,224 A * | 11/1993 | Ozaki et al. | 428/195.1 |
| 5,273,782 A * | 12/1993 | Sagawa et al. | 427/242 |
| 5,501,929 A * | 3/1996 | Kato et al. | 430/49.31 |
| 5,618,582 A | 4/1997 | VanWinckel | |
| 5,627,003 A * | 5/1997 | Laing et al. | 430/119.86 |
| 5,645,673 A * | 7/1997 | Fasano et al. | 156/89.16 |
| 8,779,993 B2 * | 7/2014 | Chiang | 343/702 |
| 2013/0082885 A1 * | 4/2013 | Chiang | 343/702 |
| 2014/0284096 A1 * | 9/2014 | Wu et al. | 174/520 |

* cited by examiner

CASING OF ELECTRONIC DEVICE AND METHOD OF MANUFACTURING THE SAME

BACKGROUND OF THE APPLICATION

1. Field of the Application

The application generally relates to a casing of an electronic device and a method of manufacturing the same, and more particularly, to a casing of an electronic device with two kinds of materials and a method of manufacturing the same.

2. Description of Related Art

Today, in order to enhance the appearance of an electronic device, it is a quite common way to form a pattern on the casing of the electronic apparatus. Usually it is implemented by using the ink-jetting process to spray ink onto the casing of electronic device or using a heat-transfer-printing film to make an ink layer heat-transfer-printed onto the casing of electronic device. With the process advancement and the increasing aesthetic consciousness, people pay more and more attentions to advance the texture sensation of the appearance of product.

If it is wanted to manufacture a casing using a combination of metal and plastic currently, insert injection molding is often used thereto. Then, against the areas of two kinds of materials on the surface of the casing of the electronic device, different materials are used to conduct surface treatment or surface decoration. For example, for the plastic area, painting is used for decoration and protection, however for the metallic area, there is no need of the same painting. In order to achieve the above effects, the traditional practice is to use a mask with the just-right dimension to cover the area of metallic material, followed by painting the area of the plastic material. However, to perfectly paint the area of the plastic material only, the dimension of the mask must be very accurate, and the alignment between the mask and the metallic material area needs very accurate as well. In fact, the manufacturing tolerances of the mask exist, the alignment error between the mask and the metallic material area exists, the dimension of the metallic material area has a process error, and the mask may fail to be unusable after several times of usages due to paint accumulation on the mask. Therefore, the traditional way by using a mask to paint a selected area is unable to achieve better accuracy.

SUMMARY OF THE APPLICATION

Accordingly, the application is directed to a manufacturing method of a casing of an electronic device, which is able to solve the problems caused by complicated and expensive process for painting a selected area in the prior art.

The application is also directed to a casing of an electronic device with a lower cost.

The manufacturing method of casing of electronic device provided by the application includes following steps: providing a casing body, in which a surface of the casing body includes a first material region and a second material region, and the materials of the first material region and the second material region are different from each other; providing a decorative material on the surface of the casing body, in which the decorative material overlays whole the first material region and at least partial the second material region; and adhering a tape on the decorative material, followed by tearing off the tape to remove the decorative material located at the second material region but remain the decorative material located at the first material region.

The application also provides a casing of electronic device, which includes a casing body and a decorative material, in which a surface of the casing body includes a first material region and a second material region, the decorative material overlays whole the first material region and the adhesive force between the decorative material and the first material region is greater than the adhesive force between the decorative material and the second material region.

Based on the description above, owing to the difference between the two adhesive force between the decorative material and the two materials of the two material regions, the tape is able to remove the unwanted decorative material and obtain the finished goods fast and in lower cost.

In order to make the features and advantages of the present application more comprehensible, the present application is further described in detail in the following with reference to the embodiments and the accompanying drawings.

DESCRIPTION OF THE EMBODIMENTS

Figure 1:
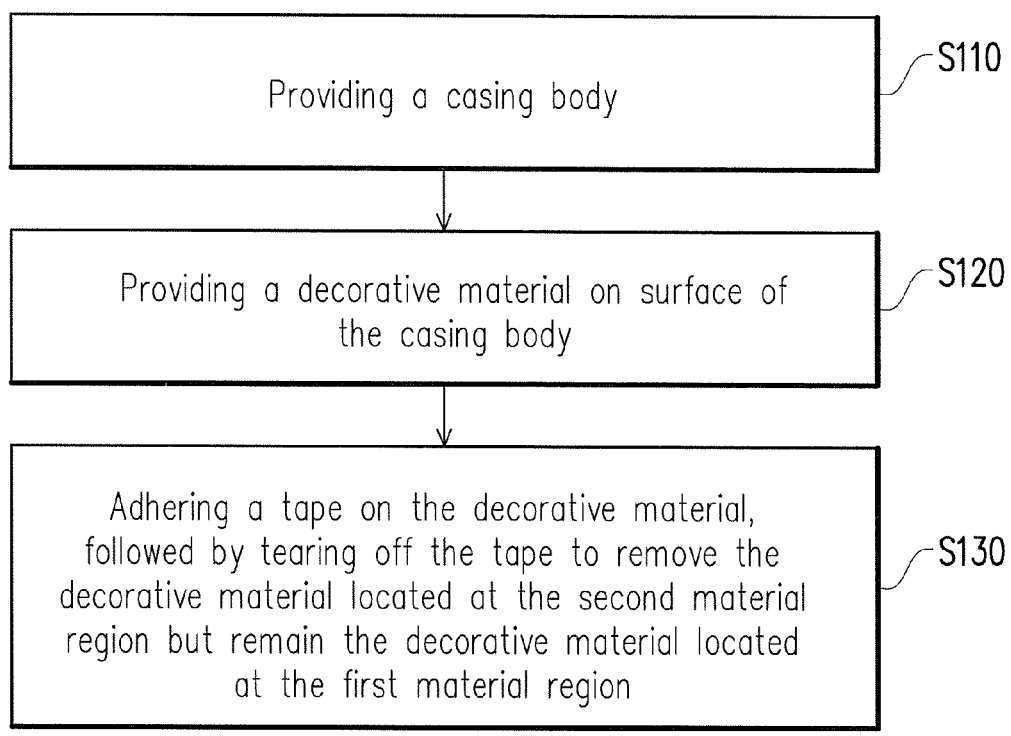
FIG. 1 is a flowchart in text to describe a manufacturing method of a casing of an electronic device according to an embodiment of the application.

FIG. 1 is a flowchart in text to describe a manufacturing method of casing of electronic device according to an embodiment of the application and FIGS. 2A-2E are flowchart through cross-sections to describe the above-mentioned manufacturing method of casing of electronic device according to another embodiment of the application.

Referring to FIG. 1, the manufacturing method of casing of electronic device according to an embodiment of the application includes following steps. It provides a casing body 110 (step S110 and referring to FIG. 2A), in which the surface of the casing body 110 includes a first material region 112 and a second material region 114, i.e., the materials of the first material region 112 and the second material region 114 on the surface of the casing body 110 are different from each other.

Next, it provides a decorative material 120 on the surface of the casing body 110 (step S120 and referring to FIG. 2D), in which the decorative material 120 overlays whole the first material region 112 and at least partial the second material region 114, i.e., in the step, it is allowed to make the decorative material 120 overlay a part of the second material region 114 without the process with high accuracy.

Figure 2A:
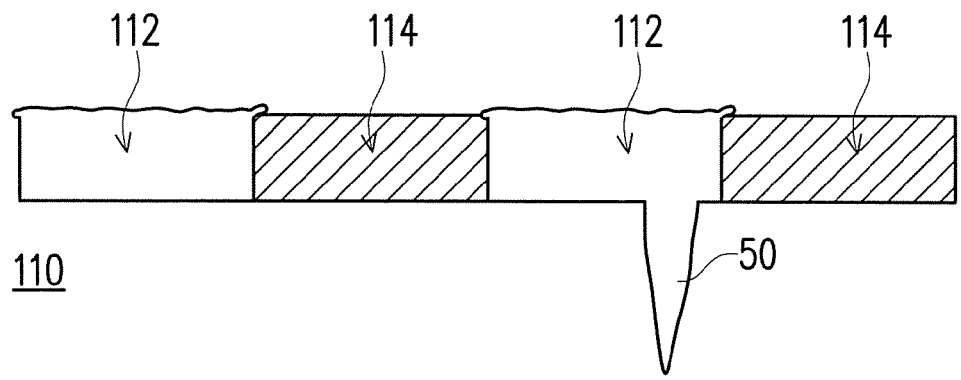
FIGS. 2A-2E are flowchart through cross-sections to describe the above-mentioned manufacturing method of casing of electronic device according to another embodiment of the application.
Figure 2B:
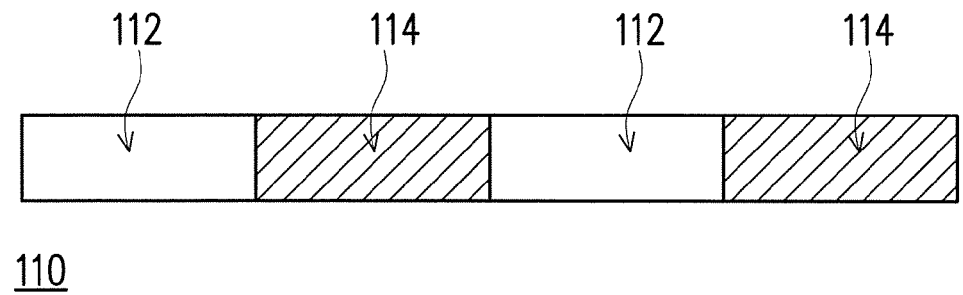
Figure 2C:
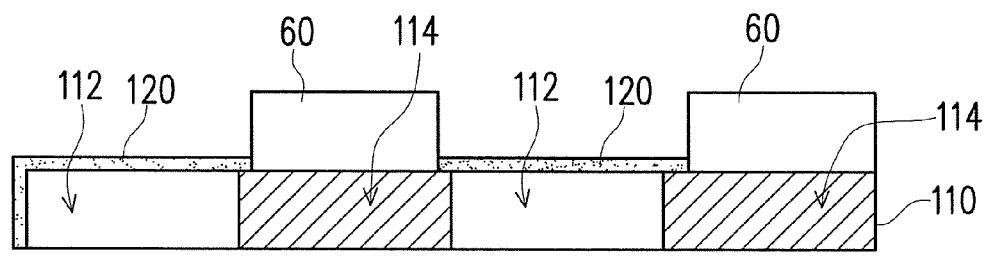
Figure 2D:
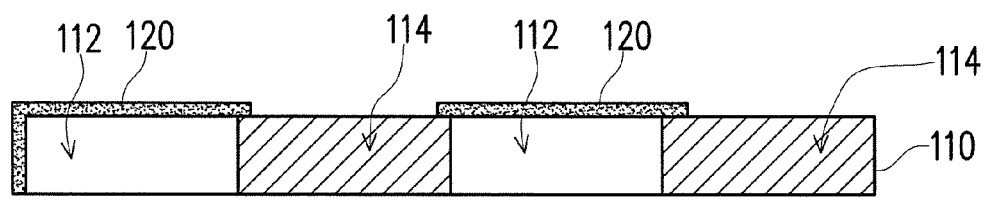
Figure 2E:
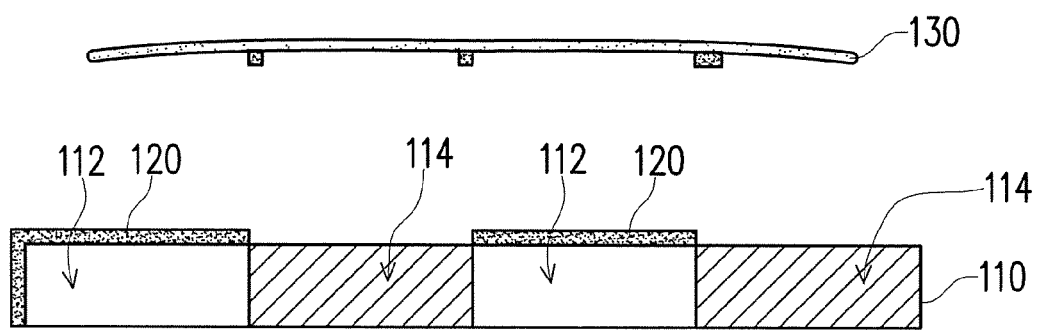

Then, it adheres a tape 130 on the decorative material 120, followed by tearing off the tape 130 to remove the decorative material 120 located at the second material region 114 but remain the decorative material 120 located at the first material region 112 (step S130 and referring to FIG. 2E). Since the adhesive force between the decorative material 120 and the material of the first material region 112 is greater than adhesive force between the decorative material 120 and the material of the second material region 114, it is easy to remove the decorative material 120 at the second material region 114 during tearing off the tape 130. Moreover, the adhesive force between the decorative material 120 located at the first material region 112 and the tape 130 is less than the adhesive force between the decorative material 120 and the first material region 112, the decorative material 120 at the first material region 112 is unable to be removed along with tearing off the tape 130 so as to remain the decorative material 120 at the first material region 112.

According to the above-mentioned description, in the manufacturing method of casing of electronic device of the application, when providing the decorative material 120 onto the surface of the casing body 110, there is no need to use a mask with accurate dimension or accurate alignment. Furthermore, the surface of the casing body 110 can be even whole overlaid to reduce the process time and the process cost. Thereafter, by using different adhesive force of the decorative material 120 on different materials, merely a tape is used to successfully remove the decorative material 120 at the second material region 114. Therefore, the manufacturing method of casing of electronic device of the application features process simplicity and lower process cost.

Referring to FIG. 2A, the casing body 110 in the embodiment is formed by using an insert injection molding process. The material of the first material region 112 is plastic or other appropriate materials; the material of the second material region 114 is metal, glass, ceramic or other appropriate materials. The second material region 114 of the casing body 110 is molded in advance, followed by injecting plastic or other appropriate materials into an insert injection mold where the casing body 110 is placed in so as to form the first material region 112. During the successive molding course, the first material region 112 and the second material region 114 are closely combined with each other, which can avoid possible assembling error if the two materials are molded respectively followed by assembling them. In addition, after the insert injection molding, it may need to remove slag 50 of material injection port. Optionally, a smoothing treatment is conducted on the surface of the casing body 110 to form the state of FIG. 2B.

Referring to FIG. 2C, in the embodiment, a mask 60 is used to overlay the second material region 114, followed by spraying the decorative material 120 onto the surface of the casing body 110, in which the mask 60 is needed to roughly overlay the second material region 114 only, i.e., the area of the mask 60 can be less than the area of the second material region 114 as long as the mask 60 does not overlay the first material region 112.

Referring to FIG. 2D, in the embodiment, the decorative material 120 on the surface of the casing body 110 can be optionally cured, where the method of curing the decorative material 120 is, for example, ultraviolet curing, thermal curing or other appropriate ways.

Referring to FIG. 2E, in the embodiment, the step of adhering the tape 130 and then tearing off the tape 130 can be conducted multiple times until the decorative material 120 on the second material region 114 is surely cleared away. If it fails to completely clear away the decorative material 120 on the second material region 114, an additional tool, for example a plastic scraper, can be used to scratch off the slag 50 of the decorative material 120 on the second material region 114.

Other embodiments are described in following. It should be noted that the component notations and partial details of the structures hereinafter provided in the embodiments can be the same as or similar to the previous embodiment, wherein the same notations represent the same or similar components while the repeated same details are omitted, which can refer to the previous embodiment.

Referring to FIG. 2E, a casing of an electronic device in an embodiment of the application includes a casing body 110 and a decorative material 120, in which the surface of the casing body 110 includes a first material region 112 and a second material region 114. The decorative material 120 overlays whole the first material region 112. The adhesive force between the decorative material 120 and the first material region 112 is greater than the adhesive force between the decorative material 120 and the second material region 114. For example, the difference between the adhesive force between the decorative material 120 and the first material region 112 and the adhesive force between the decorative material 120 and the second material region 114 is greater than 4B. The adhesive force between the decorative material 120 and the first material region 112 and the adhesive force between the decorative material 120 and the second material region 114 can be decided by conducting a testing of crosshatch adhesion judging criteria (CHAJC) according to the standard of ASTM D3359-97. Generally, the CHAJC testing is used to test the attaching degree after two objects are completely adhered to each other. The testing result is divided into grade 0B grade to grade 5B, where the higher the grade, the more firm the adhesive force is. The testing method is that a CHAJC knife is used to scratch out 10×10 pieces of small grids with 1 mm×1 mm each on the surface of the decorative material 120 and the depth of each scored line must make the line deep to the casing body 110; a brush is used to clear away the chips at the testing area; then, a tape with No. 610 sold under the trademark 3M or an equivalent tape is used to firmly adhere the small grids to be tested, and an eraser is used to hardly rub the tape to enhance the contact area of the area to be tested and the adhesive force; finally, a hand is used to grasp an end of the tape, followed by quickly tear down the tape in the vertical direction (90°), where the same testing is conducted at the same position twice.

Figure 5:
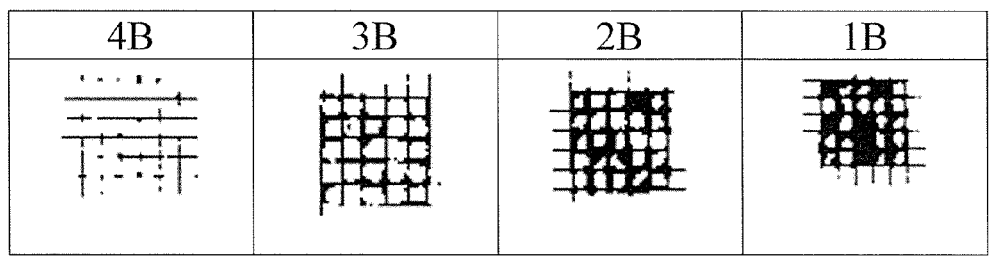
FIG. 5 shows the typical peeling states for the ASTM grades 4B-1B.

For the ASTM grade 5B, the edges of the cuts are completely smooth, none of the squares of the lattice are detached; for the ASTM grade 4B, detachment of small flakes of the coating peel at the intersections of the cuts, and a cross cut area not significantly greater than 5%; for the ASTM grade 3B, the coating has flaked along the edges and/or at the intersections of the cuts, and a cross cut area significantly greater than 5% but not significantly greater than 15% is affected; for the ASTM grade 2B, the coating has flaked along the edges of the cuts, partly or wholly in large ribbons, and/or it has flaked partly or wholly on different parts of the squares, and a cross cut area significantly greater than 15% but not significantly greater than 35% is affected; for the ASTM grade 1B, the coating has flaked along the edges of the cuts in large ribbons and/or some squares have detached partly or wholly, and a cross cut area significantly greater than 35% but not significantly greater than 65% is affected; for the ASTM grade 0B, it is allowed the coating has flakes along the edges and/or at the intersections of the cuts, and a cross cut area is greater than 65%. The typical peeling states for the ASTM grades 4B-1B are shown FIG. 5.

Assuming for example, the difference between the adhesive force between the decorative material 120 and the first material region 112 and the adhesive force between the decorative material 120 and the second material region 114 is greater than grade 4B; for example, the adhesive force between the decorative material 120 and the first material region 112 is grade 5B and the adhesive force between the decorative material 120 and the second material region 114 is grade 1B; for example, the adhesive force between the decorative material 120 and the first material region 112 is grade 4B and the adhesive force between the decorative material 120 and the second material region 114 is grade 0B.

Thus, only a tape is needed to successfully remove the decorative material 120 overlaying ever before the second material region 114 in the manufacturing process, which simplifies the process and reduces the process cost. In the casing of electronic device in the embodiment, the method of overlaying the first material region 112 by the decorative material 120 can be the steps shown in FIG. 1. The decorative material 120 in the embodiment contains butyl acetate with 5%-25% concentration, methyl ethyl ketone with 1%-25% concentration, ethyl acetate with 5%-25% concentration, methyl isobutyl ketone (MIBK) with 1%-25% concentration and acrylate resin with 35%-65% concentration.

Figure 3:
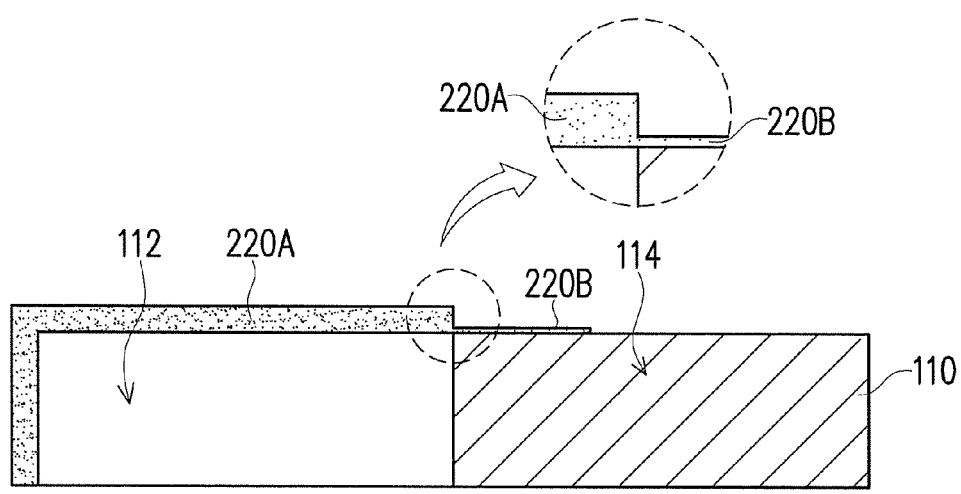
FIG. 3 is a cross-sectional diagram of a casing of electronic device according to yet another embodiment of the application.

FIG. 3 is a cross-sectional diagram of a casing of electronic device according to yet another embodiment of the application. Referring to FIG. 3, in the embodiment, a part of the decorative material 220B is located at the second material region 114, and the thickness of the decorative material 220B at the second material region 114 is 1/10-1/5 time of the thickness of the decorative material 220A at the first material region 112, which is because during removing the decorative material 220B at the second material region 114, limited by the process, it is possible, for example, non-uniformly spraying the decorative material or adhering the tape occur so as to fail to remove entirely the decorative material 220B, but it does not affect the goal of merely forming the visual appearance by the decorative material 220A at the first material region 112.

Figure 4:
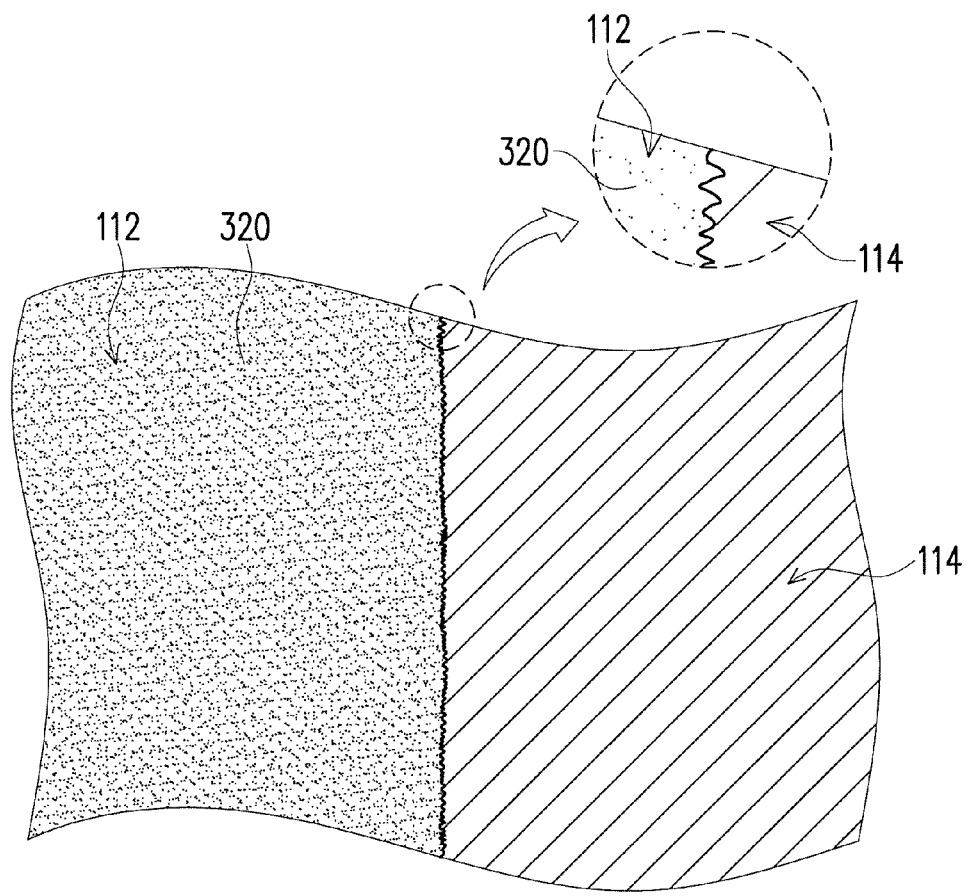
FIG. 4 is a cross-sectional diagram of a casing of electronic device according to yet another embodiment of the application.

FIG. 4 is a cross-sectional diagram of a casing of an electronic device according to yet another embodiment of the application. Referring to FIG. 4, in the embodiment, the decorative material 320 at the border between the first material region 112 and the second material region 114 has tiny and irregular jagged fractures, which is because during removing the decorative material 320 at the second material region 114, limited by the process, it is possible, for example, non-uniformly spraying the decorative material or adhering the tape occur so as to leave the tiny and irregular jagged fractures, but it does not affect the goal of merely forming the visual appearance by the decorative material 320 at the first material region 112.

In summary, in the casing of the electronic device and the manufacturing method thereof in the application, due to the difference between the two adhesive force between the decorative material and the two materials, it does not need a mask with accurate dimension and an accurate alignment for providing the decorative material on the casing body. Instead, only a tape is used to remove the unwanted decorative material, which makes the process much simple and a lower process cost.

It will be apparent to those skilled in the art that the descriptions above are several preferred embodiments of the application only, which does not limit the implementing range of the application. Various modifications and variations can be made to the structure of the application without departing from the scope or spirit of the application. The claim scope of the application is defined by the claims hereinafter.

What is claimed is:
1. A manufacturing method of casing of electronic device, comprising:

providing a casing body, wherein a surface of the casing body comprises a first material region and a second material region, and materials of the first material region and the second material region are different from each other;

providing a decorative material on the surface of the casing body, wherein the decorative material overlays whole the first material region and at least partial the second material region; and adhering a tape on the decorative material, followed by tearing off the tape to remove the decorative material located at the second material region but remain the decorative material located at the first material region.

2. The manufacturing method of casing of electronic device as claimed in claim 1, wherein the casing body is formed by using insert injection molding process.

3. The manufacturing method of casing of electronic device as claimed in claim 1, wherein material of the first material region is plastic.

4. The manufacturing method of casing of electronic device as claimed in claim 1, wherein material of the second material region is metal, glass or ceramic.

5. The manufacturing method of casing of electronic device as claimed in claim 1, wherein the step of providing a decorative material on the surface of the casing body comprises:

spraying the decorative material onto the surface of the casing body; and curing the decorative material on the surface of the casing body.

6. The manufacturing method of casing of electronic device as claimed in claim 5, wherein the step of providing a decorative material on the surface of the casing body further comprises:

prior to spraying the decorative material onto the surface of the casing body, overlaying the second material region with a mask.

7. The manufacturing method of casing of electronic device as claimed in claim 6, wherein area of the mask is less than area of the second material region.

8. The manufacturing method of casing of electronic device as claimed in claim 5, wherein the method of curing the decorative material is ultraviolet curing or thermal curing.

9. The manufacturing method of casing of electronic device as claimed in claim 1, further comprising performing a smoothing treatment on the surface of the casing body after providing the casing body but prior to providing the decorative material.

10. The manufacturing method of casing of electronic device as claimed in claim 1, wherein the step of adhering a tape and then tearing off the tape is conducted multiple times.

11. The manufacturing method of casing of electronic device as claimed in claim 1, further comprising scraping off slag of the decorative material located at the second material region after tearing off the tape.

12. The manufacturing method of casing of electronic device as claimed in claim 1, wherein adhesive force between the decorative material at the second material region and the tape is greater than adhesive force between the decorative material and the second material region, and adhesive force between the decorative material of at first material region and the tape is less than adhesive force between the decorative material and the first material region.

* * * * *